United States Patent [19]

Schomburg et al.

[11] Patent Number: 5,569,855

[45] Date of Patent: Oct. 29, 1996

[54] METHOD OF MANUFACTURING A FRAME-MOUNTED MEMBRANE

[75] Inventors: Werner Schomburg, Pfinztal; Richard Rapp, Stutensee; Klaus Kadel, Dortmund, all of Germany

[73] Assignee: Forschungszentrum Karlsruhe GmbH, Karlsruhe, Germany

[21] Appl. No.: 492,833

[22] Filed: Jun. 19, 1995

Related U.S. Appl. Data

[63] Continuation of PCT/EP93/02969, Oct. 27, 1993.

[30] Foreign Application Priority Data

Nov. 16, 1992 [DE] Germany .................... 42 38 571.7

[51] Int. Cl.⁶ ........................................ G01L 7/00
[52] U.S. Cl. .................................................. 73/700
[58] Field of Search ..................... 73/700, 703; 29/594, 29/904; 92/96, 100; 310/313 A, 313 B

[56] References Cited

U.S. PATENT DOCUMENTS 4,231,287  9/1980  Smiley .
4,382,386  5/1983  Coussot et al. .................... 73/703

FOREIGN PATENT DOCUMENTS

| 0 381 046 | 8/1990 | European Pat. Off. . |
| 0 474280 | 11/1992 | European Pat. Off. . |
| 961680 | 5/1950 | France ............................ 73/700 |
| 1 174 795 | 3/1959 | France . |
| 38 02 545 | 8/1989 | Germany . |
| 39 20 788 | 12/1990 | Germany . |

OTHER PUBLICATIONS

Japanese Patent Abstract, Kenji Kobayashi, "Process For Making Diaphragm by Photoetching", Oct. 21, 1976.

*Primary Examiner*—Richard Chilcot
*Assistant Examiner*—William L. Oen
*Attorney, Agent, or Firm*—Klaus J. Bach

[57] ABSTRACT

In a method of manufacturing frame-mounted membranes, a first membrane layer is formed on a substrate and openings are formed in this membrane layer which are then covered by a second membrane layer, a frame structure is formed on the membrane layers around the openings and the membrane layers with the frame structure are separated from the substrate to provide the frame-mounted membranes.

11 Claims, 2 Drawing Sheets

1

METHOD OF MANUFACTURING A FRAME-MOUNTED MEMBRANE

This is a continuation-in-part application of international application PCT/EP93/02969 filed Oct. 27, 1993 claiming the priority of German application p 42 38 571.7 filed Nov. 16, 1992.

BACKGROUND OF THE INVENTION

The invention relates to a method of manufacturing a frame-mounted membrane and to membrane pumps and membrane valves utilizing membranes manufactured in this manner.

A method of making a thin membrane is known from German Patent DE 39 20 788 C1 and also from a publication "Mikromembranen für berührungslose Messungen mit Ultra-schall" (Micromembranes for Contact-free Measurements with Ultrasound) by W. K. Schomburg, M. Walter, R. Köhler, and V. Liebig, VDI—Berichte No. 939 (1992), pages 543–548. The publication describes the manufacture of honeycomb-like micromembranes of titanium which have a thickness of 3 µm and lateral dimension of about 80 µm and which are freely mounted on a frame. Those micromembranes had a resonance frequency of 3 Mhz. The resonance frequency is dependent, among other factors, on the temperature, the membrane tension and the differential pressure on the membrane, so that these parameters can be determined with such a membrane. The frame-mounted micromembranes are manufactured in the following manner:

On a silicon wafer which serves as a substrate, a membrane layer is so deposited that it can be easily separated therefrom. For this purpose, an about 100 nm thin separation layer of carbon is first applied to the silicon wafer, wherein an edge section of the silicon wafer of about 3 mm is left uncoated. Then a 3 µm thick layer of titanium is deposited thereon by magnetron spattering which attaches to the silicon wafer only at the uncoated edges. On this membrane layer, a relatively thick honey-comb nickel structure of at least 10 µm in thickness is formed by the known process of x-ray depth lithography with subsequent galvanic forming. Around the nickel structure, a solid raised frame is bonded to the membrane layer and the membrane layer is removed from the silicon wafer along the edges. Then there is no firm connection left between the membrane layer and the silicon wafer so that the silicon wafer can be removed from the membrane layer in a special device by subjecting it to a slight bending. In this manner, a frame-mounted membrane is obtained, which is divided by the nickel structure into micromembranes.

With the known method, membranes with uniform properties are obtained. The lateral deflection of the membranes is determined, among others, by the membrane dimensions, the membrane thickness, the inner mechanical tension and the modulus of elasticity of the membrane. For certain applications such as the manufacture of micromembrane pumps or micromembrane valves, frame-mounted membranes with locally different properties are more advantageous. It may, for example, be advantageous for a micromembrane pump if the membrane is more resilient in the area of the pump chamber than in the area of the supply lines and the valves. Furthermore, a particular material property such as electric conductivity may be important for the manufacturing process of a membrane pump, whereas in the areas of the valves or the pump membrane, other properties such as resiliency are most important and that all these properties cannot be optimized for a particular location.

It is, therefore, the principal object of the present application to provide a method of manufacturing a frame-mounted membrane which can have different physical properties at predetermined locations.

SUMMARY OF THE INVENTION

In a method of manufacturing frame-mounted membranes, a first membrane layer is formed on a substrate and openings are formed in this first membrane layer which are then covered by a second membrane layer. A frame structure is formed on the membrane layers around the openings and the membrane layers with the frame structure are separated from the substrate to provide the frame-mounted membranes.

It is important, in connection with the present invention, that at the place or places where the membrane should exhibit different physical properties, the membrane layer first applied to the silicon wafer is provided with an opening. The location and the size of this opening determines the location at which the finished membrane exhibits—with regard to the remainder of the membrane—a different physical property such as resiliency or vibration characteristics.

The opening in the first deposited membrane layer is covered by a second membrane, wherein the second membrane layer usually overlaps the first membrane layer. The overlapping area depends on the kind of membrane layers and the desired properties of the complete membrane which consists of the first and the second membrane layers. The overlapping area can be restricted to the edge around the opening or it can comprise the whole first membrane area.

Structuring of the membrane layers can be achieved in the known manner by optical lithographic procedures with subsequent wet chemical etching.

Preferably, the substrate is provided with a separation layer before the first membrane is deposited. The separation layer is so selected that attachment to the substrate of the first as well as the second membrane layer is prevented. In most cases, separation layers of carbon and/or gold are suitable for this purpose. Carbon is particularly suitable if the first and the second membrane layer consist of a metal. Gold is used if the second membrane layer consists, for example, of a plastic material.

In principle, the first and second membrane layers do not need to consist of different materials. To obtain different localized properties, it would be sufficient if the composite membrane has a different thickness at the locations where the openings are located or a different inner tension. At those locations, there are then, for example, different tension or vibration characteristics.

In many cases, however, it is more advantageous if different materials are used for the first and second layers since, in this way, the physical properties in the area of the openings can be changed to a much greater degree.

In a preferred embodiment, the first membrane layer consists of a metal such as titanium and the second membrane layer consists of a plastic material. In this case, as the plastic material, a polymer or a copolymer is preferably selected which can be structured by lithographic procedures (by light or x-ray irradiation and subsequent dissolution of either the irradiated or non-irradiated areas). A plastic material particularly suited herefor is polyimide. A membrane comprising a first membrane layer consisting of a metal such as titanium and a second membrane layer consisting of polyimide will have local physical properties which are especially different from those of the surrounding membrane structures.

If membranes with vibration characteristics that are different for different membrane areas are desired, the membrane layers may also both consist of a metal. A preferred combination is, for example, titanium/tungsten.

The frame of the complete membrane can be provided with a cover plate extending over the whole structure. The structure obtained thereby is particularly suitable for use in micromembrane pumps and micromembrane valves. The medium delivery structure can then be integrated into the frame.

The invention will be described below in greater detail for two embodiments on the basis of the enclosed drawings.

DESCRIPTION OF THE PREFERRED EMBODIMENTS

Figure 1A:
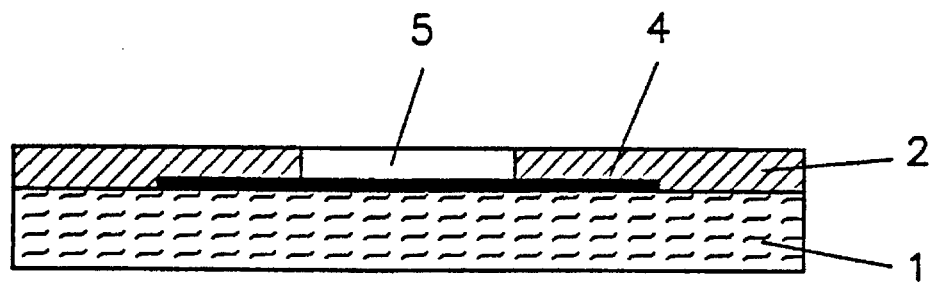
FIGS. 1a, 1b, and 1c schematically show the method steps employed for making one type of membrane

First, the manufacture of a membrane with locally different resiliencies by means of two separation layers will be described:

As described in the publication referred to in the introductory part of this description, a round silicon wafer 1 with a thickness of 0.5 mm and a diameter of 100 mm was provided with a thin separation layer 4 of carbon which had a thickness of 100 nm and which was applied by magnetron spattering (see FIG. 1a). At the edges of the silicon wafer, a strip of about 3 mm width was left free of the carbon coating. On the silicon wafer 1 and the carbon layer 4, a thin titanium layer 2 of 2.7 µm thickness was then deposited by magnetron spattering. After deposition the titanium layer 2 first experienced a mechanical compressive strain of about 600 N/mm². After heating the titanium layer 2 to about 450° C. for half an hour, the strain in the titanium layer had changed to a tensile strain of about 200 N/mm². The module of elasticity of the titanium layer was about 130,000 N/mm². The surface of the titanium layer was oxidized and chemically roughened by a treatment with hydrogen peroxide.

With the known methods of photolithography and by wet chemical etching with a solution which contained 5% hydrofluoric acid and a surface wetting liquid (tensid), circular areas of the titanium layer with diameters of between 0.1 and 5 mm were dissolved. The sample was then coated, by cathode spattering in a parallel plate reactor, with an about 50 nm thin layer of gold 6, which had only very light adherence to the silicon wafer (see FIG. 1b). The adherence of the gold layer 6 to the oxidized titanium surface in contrast was much greater.

The sample was then coated with a 1.5 µm thin layer of a commercially available, lithographically structurable polyimide 3. Within the polyimide layer 3, an internal tensile stress of about 50 N/mm² developed. The modulus of elasticity of the polyimide layer was only about 3500 N/mm². Consequently, the polyimide layer was substantially more resilient than the titanium layer.

Figure 1B:
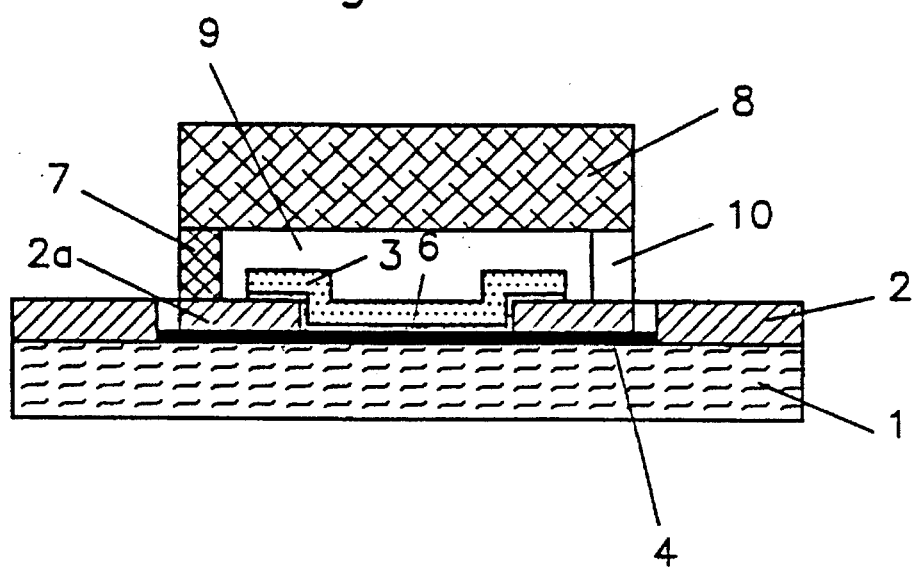

The polyimide layer was structured by the known methods of photolithography in such a manner that the circular openings 5 in the titanium layer 2 remained covered with a polyimide layer 3 beyond their edges (see FIG. 1b). Because of the gold layer 6, the adherence of the polyimide layer 3 to the silicon wafer 1 was much reduced. Outside the polyimide layer disc, the thin gold layer 6 was removed by an argon plasma beam so that, in the subsequent formation of microstructures around the polyimide layer 3, no reduced adherence of the microstructures to the titanium as a result of the gold layer 6 would occur.

E. W. Becker et al, Microcircuit Engineering 4 (1986), pages 35 to 56, describe a "LIGA" process (X-ray depth lithography and galvanic forming) which was used to build up microstructures 7 of copper around the polyimide layers 3 which then were closed by a cover plate 8 so that pump chambers 9 with supply passages 10 were formed (FIG. 1b). The galvanic deposition of copper on the titanium layer as obtained by the LIGA process was possible because the electrically insulating polyimide had first been structured. In this way, the galvanizing electrolyte obtained a direct access to the electrically conductive titanium surface.

Figure 1C:
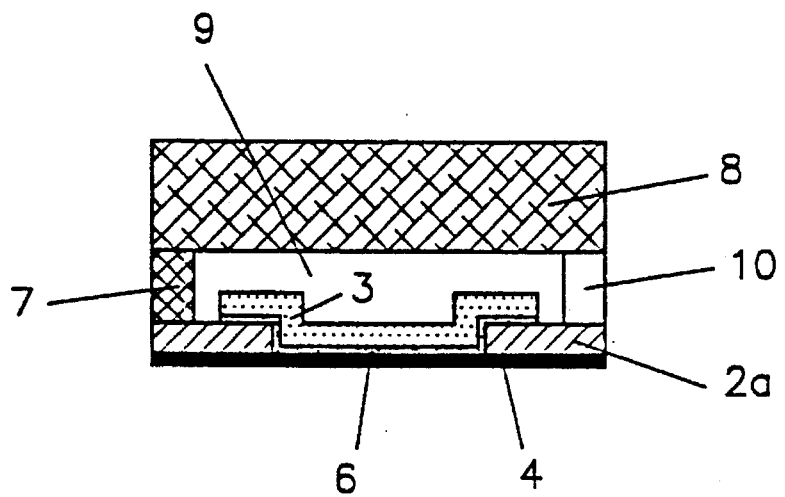

The titanium layer 2 was severed around the copper structures 7 and the cover plate 8. The structures 7 together with the titanium layer 2a and the polyimide layer 3 adhering thereto via the gold layer 6 were separated from the silicon wafer 1 (FIG. 1c). The separation can be done simply in a mechanical procedure without dissolution of any layer because the separating layers 4 and 6 facilitate such a procedure. Tests showed that the gold layer 6 is not needed if the openings 5 in the titanium layer are smaller in diameter than about 10 µm. If the openings 5 in the titanium layer are larger, the polyimide layer is somewhat damaged during the mechanical separation of the silicon wafer 1 because of its smaller inner tensile strain and its smaller module of elasticity. Since the gold layer between the titanium layer 2a and the silicon wafer 1 may not provide for as good a removability as the gold layer between the polyimide layer 3 and the silicon wafer 1, it is not always possible to replace the separation layer 4 by gold and to omit separation layer 6. In addition, there is the danger that the separation layer 4 is damaged during etching of the area of the opening 5 in the titanium layer 2 so that separation of the polyimide layer and the silicon wafer without damage may be insured only by providing the gold layer 6.

By a periodic movement of the polyimide membrane 3 by means of a drive, it is then possible to fill the pumping chamber with a medium and to empty it. The large resiliency of the polyimide membrane 3 reduces the energy requirements for the deflection of the membrane whereas the feedlines 10 are closed by an only slightly resilient titanium membrane.

For clarity reasons, FIG. 1 illustrates the manufacture of a membrane which has been made locally more resilient only at one area 5. But it is possible to provide a membrane with a number of such places which are more resilient and to make in this manner a number of pump chambers in one procedure in a cost effective manner.

If the surfaces 5 have a relatively large diameter, it was frequently found that the carbon layer 4 was damaged in the area of the dissolved titanium layer. This damage precluded the manufacture of layers formed thereon without damage. It was, therefore, found to be advantageous to remove the carbon layer 4 from large surface areas 5 preferably by means of an oxygen plasma.

In the second embodiment, the manufacture of a sensor structure is described without the use of separation layers wherein the sensor structure consists of a microstructure mounted membrane with locally different vibration characteristics.

An about 2 μm thin tungsten layer 2 is applied to a 4 mm thick titanium plate by a cathode spattering process. By suitable selection of the manufacturing conditions, a tensile strain of about 100 N/mm$^2$ is generated in the tungsten layer. With the known photolithographic methods and wet chemical etching, hexagonal openings 5 are formed into the tungsten layer (see FIG. 2a). This sample is then coated with a 1 μm thin layer 3 of copper. The copper layer 3 is also adjusted to have an inner tensile strain of 100 N/mm$^2$. At the edges around the openings 5 in the tungsten layer, a honeycomb microstructure of copper is formed in such a way that alternate honeycombs consist of layers of tungsten and copper and, respectively, only of copper (see FIG. 2b). The manufacturing process for the sensor structures is completed by dissolving the titanium plate in an aqueous solution containing hydrofluoric acid. In this manner, a free-standing honeycomb structure is formed wherein half of the honey combs are covered by micromembranes of copper and the other half by bimetal micromembranes of copper and tungsten (FIG. 2c).

With ultrasound, the micromembranes can be excited to vibrate at frequencies of several MHz. Because of their different densities and thicknesses, the micromembranes have different resonance frequencies which can be determined by analyzing the ultrasound signal passed through the membranes. The location of the resonance frequency of the bimetal membranes is temperature-dependent whereas the micromembranes of copper have almost no temperature dependency. However, the location of the resonance frequency for both types of micromembranes is dependent on the tensile stress applied to, that is the extension of the microstructure by outside forces. By calibration and concurrent measuring and recording of the resonance frequencies of both membrane types, the stress on, or the temperature of, the sensor structure can be determined. If the sensor structure described herein is placed somewhere within a human body, it is therefore possible to determine an elongation and the temperature within the body by ultrasonic measurements from outside the body that is from outside the skin.

Figure 2A:
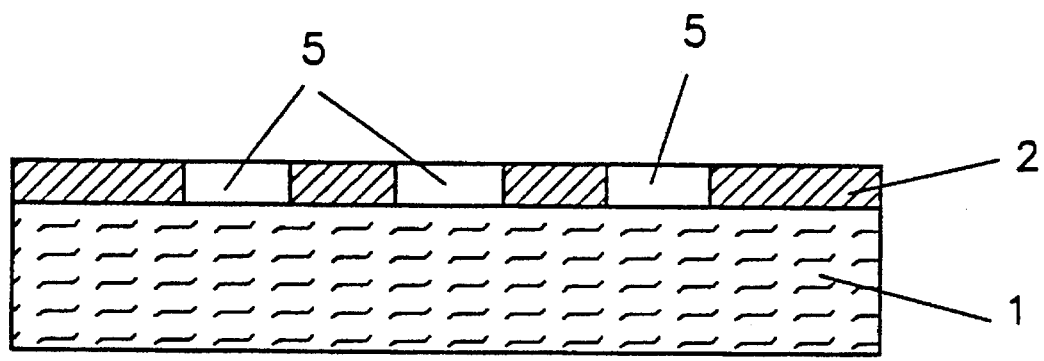
FIGS. 2a, 2b, and 2c show the steps for making another type of membrane.
Figure 2B:
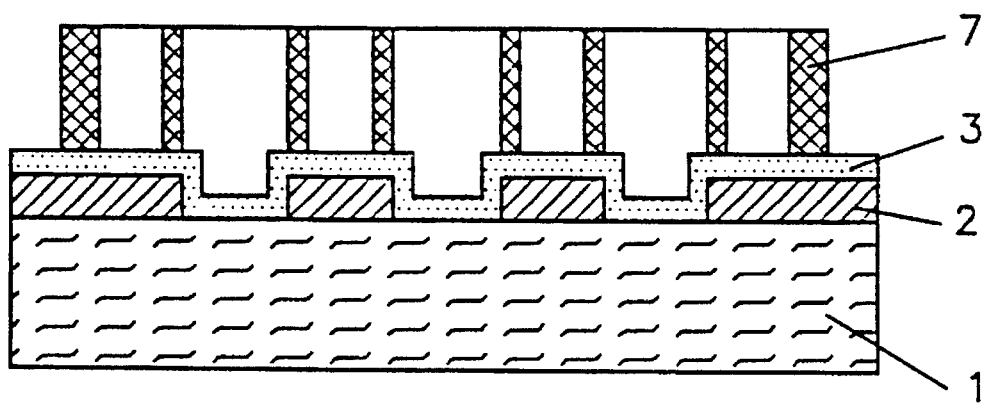
Figure 2C:
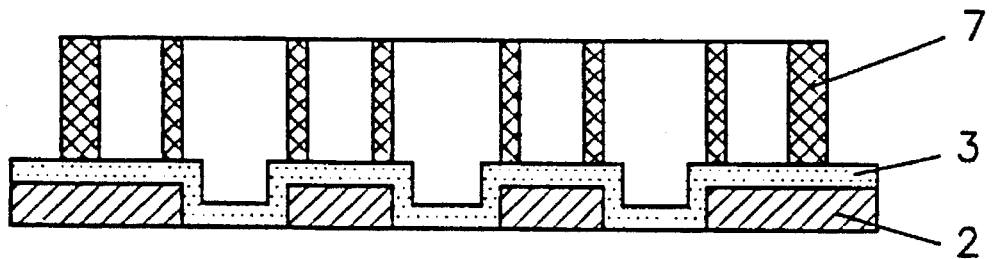

FIGS. 2a–2c show, for reasons of clarity, a sensor structure consisting of only several honeycombs. But it is possible to manufacture concurrently several sensor structures side-by-side thereby reducing the production costs.

What is claimed is:

1. A method of manufacturing frame-mounted membranes comprising the steps of;
    a) providing a substrate,
    b) applying to said substrate a first membrane layer in such a way that it can be separated from said substrate,
    c) forming at least one opening into said first membrane layer,
    d) covering said opening with a second membrane layer,
    e) forming a frame structure on said first and second membrane layers so as to extend around said at least one opening, and
    f) separating said membrane layers with said frame structure from said substrate.

2. A method according to claim 1, wherein at least a first separation layer is applied to said substrate before said first membrane layer is applied to said substrate.

3. A method according to claim 2, wherein a second separation layer is applied to said first separation layer in the area of said opening.

4. A method according to claim 2, wherein said first separation layer is removed in the area of said opening and replaced by a second separation layer consisting of a different material.

5. A method according to claim 2, wherein said first separation layer consists of one of the group comprising carbon and gold.

6. A method according to claim 3, wherein said separation layers consist of one of the group comprising carbon and gold.

7. A method according to claim 4, wherein said separation layers consist of one of the group comprising carbon and gold.

8. A method according to claim 1, wherein said first membrane layer consists of a metal and said second membrane layer consists of a plastic material.

9. A method according to claim 8, wherein said plastic material comprises one that can be structured by photolithographic methods.

10. A method according to claim 1, wherein said first membrane layer and said second membrane layer consist of different metals.

11. A method according to claim 1, wherein a cover plate is mounted on said frame structure.

\* \* \* \* \*